United States Patent
Natarajan et al.

(10) Patent No.: US 10,403,622 B2
(45) Date of Patent: Sep. 3, 2019

(54) ELECTROSTATIC DISCHARGE PROTECTION DEVICE AND METHODS

(71) Applicant: GLOBALFOUNDRIES Inc., Grand Cayman (KY)

(72) Inventors: Mahadeva Iyer Natarajan, Clifton Park, NY (US); Haojun Zhang, Schenectady, NY (US); Chien-Hsin Lee, Vancouver (CA)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/889,635

(22) Filed: Feb. 6, 2018

(65) Prior Publication Data

US 2019/0244954 A1 Aug. 8, 2019

(51) Int. Cl.
| | |
|---|---|
| H01L 23/48 | (2006.01) |
| H01L 27/02 | (2006.01) |
| H01L 23/528 | (2006.01) |
| H01L 21/768 | (2006.01) |
| H01L 23/532 | (2006.01) |

(52) U.S. Cl.
CPC ........ *H01L 27/0292* (2013.01); *H01L 21/768* (2013.01); *H01L 23/528* (2013.01); *H01L 23/53223* (2013.01); *H01L 23/53238* (2013.01)

(58) Field of Classification Search
CPC .................................................. H01L 27/0292
USPC ....................................................... 257/773
See application file for complete search history.

(56) References Cited

U.S. PATENT DOCUMENTS

| | | |
|---|---|---|
| 8,295,018 B2 | 10/2012 | Hsieh et al. |
| 8,504,952 B2 | 8/2013 | Yehezkely |
| 2008/0004820 A1* | 1/2008 | Nakaie ............... G01R 27/04 |
| | | 702/65 |
| 2008/0112101 A1 | 5/2008 | McElwee et al. |

FOREIGN PATENT DOCUMENTS

CN 102255626 B 8/2013

OTHER PUBLICATIONS

Tsai et al., "ESD Protection Design for Microwave/Millimeter Wave Low-Noise Amplifiers", IEEE International Wireless Symposium (IWS), Mar. 24-26, 2014, X'ian, China.
Zhong et al., "A New Approach of ESD Protection for Millimeter Wave Transceivers", 10th IEEE International Conference on Solid-State and Integrated Circuit Technology (ICSICT), Nov. 1-4, 2010, Shanghai, China.
Thijs et al., "CDM Protection for Millimeter-Wave Circuits", 33rd Electrical Overstress/Electrostatic Discharge Symposium (EOS/ESD), Sep. 11-16, 2011, Anaheim, CA.

(Continued)

*Primary Examiner* — Ajay Arora
(74) *Attorney, Agent, or Firm* — Thompson Hine LLP; Anthony Canale

(57) ABSTRACT

Structures for a frequency divider, methods of fabricating a frequency divider, and method of using a frequency divider. A first interconnect line is configured to selectively conduct a first signal of a first frequency. A second interconnect line is coupled with the first interconnect line. The second interconnect line is configured to selectively conduct a second signal of a second frequency. The first frequency is less the second frequency.

20 Claims, 1 Drawing Sheet

(56) References Cited

OTHER PUBLICATIONS

Thijs, et al., "ESD Protection for a 5.5 GHz LNA in 90 nm RF CMOS—Implementation Concepts, Constraints and Solutions" Electrical Overstress/Electrostatic Discharge Symposium, Sep. 19-23, 2004, Grapevine, TX.

Zhang, et al., "New Analytical Equations for Skin and Proximity Effects in Interconnects Operated at High Frequency", Electron Devices Technology and Manufacturing Conference, Feb. 28-Mar. 2, 2017.

* cited by examiner

ELECTROSTATIC DISCHARGE PROTECTION DEVICE AND METHODS

BACKGROUND

The invention relates generally to integrated circuits and semiconductor device fabrication and, in particular, to structures that provide electrostatic discharge (ESD) protection and methods for fabricating a structure that provides ESD protection.

An integrated circuit may be exposed to random ESD events that can direct potentially large and damaging ESD currents to the integrated circuits of the chip. An ESD event refers to an electrical discharge of a current (positive or negative) over a short duration and during which a large amount of current is directed to the integrated circuits. The high current may originate from a variety of sources, such as the human body, a machine component, a carrier, etc.

Precautions may be taken to avoid causing ESD events or to protect an integrated circuit from ESD events. One such precaution is to incorporate an ESD prevention circuit into the chip. The ESD protection circuit can prevent damage to sensitive devices of the integrated circuit during post-manufacture chip handling and after chip installation on a circuit board or other carrier. If an ESD event occurs, the ESD protection circuit triggers an ESD protection device, such as a silicon-controlled rectifier, to enter a low-impedance state that conducts ESD current to ground and away from the sensitive devices of the integrated circuit. The ESD protection device is clamped in its low-impedance state until the ESD current is drained and the ESD voltage is discharged to an acceptable level.

Improved structures that provide ESD protection and methods for fabricating a structure that provides ESD protection are needed.

SUMMARY

In an embodiment of the invention, a structure is provided for a frequency divider. The structure includes a first interconnect line that is configured to selectively conduct a first signal of a first frequency. A second interconnect line is coupled with the first interconnect line. The second interconnect line is configured to selectively conduct a second signal of a second frequency. The first frequency is less than the second frequency.

In an embodiment of the invention, a method includes selectively conducting a first signal of a first frequency through a first interconnect line, and selectively conducting a second signal of a second frequency through a second interconnect line coupled with the first interconnect line. The first frequency is less than the second frequency.

In an embodiment of the invention, a method includes forming a first interconnect line configured to selectively conduct a first signal of a first frequency, and forming a second interconnect line coupled with the first interconnect line, the second interconnect line configured to selectively conduct a second signal of a second frequency. The first frequency is less than the second frequency.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
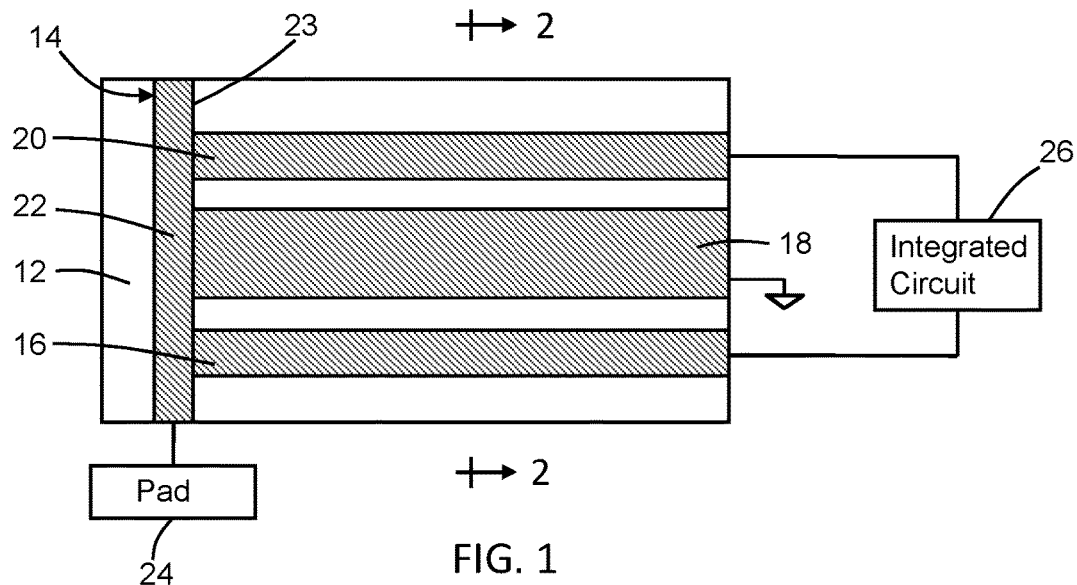
FIG. 1 is a top view of a structure in accordance with embodiments of the invention.

With reference to FIG. 1 and in accordance with embodiments of the invention, a back-end-of-line (BEOL) interconnect structure includes a routing or metallization level 10 with an interlayer dielectric layer 12 constituting an interlayer dielectric (ILD) and a wiring feature 14 embedded as a structure in the interlayer dielectric layer 12. Additional metallization levels (not shown) may exist beneath and/or above the metallization level 10. The interlayer dielectric layer 12 may be comprised of an electrical insulator, such as silicon dioxide ($SiO_2$) or a low-k dielectric material. The wiring feature 14 of the metallization level 10 may be comprised of a metal such as copper (Cu), aluminum (Al), or cobalt (Co), with additional liner and barrier layers (e.g., tantalum nitride (TaN) or titanium nitride (TiN)) also present. The BEOL interconnect structure, including the metallization level 10, is carried on a die or chip (not shown) that has been processed by front-end-of-line (FEOL) processes, such as a complementary metal-oxide-semiconductor (CMOS) process, to fabricate one or more integrated circuits that contain device structures. Conductive features in the different metallization levels of the BEOL interconnect structure function to interconnect devices of the integrated circuit and may provide circuit-to-circuit connections, or may establish contacts with input and output terminals.

The wiring feature 14 includes individual interconnect lines 16, 18, 20 that are connected together by an interconnect line 22. In the representative embodiment, the interconnect lines 16, 18, 20 are aligned orthogonal to a side edge 23 of the interconnect line 22, and the interconnect line 18 is laterally arranged between the interconnect line 16 and the interconnect line 20. The interconnect lines 16, 18, 20 may have a parallel arrangement in which the interconnect lines 16 and 18 are the same distance apart at every point along their lengths, and the interconnect lines 18 and 20 are the same distance apart at every point along their lengths.

The interconnect line 22 may be coupled with a pad 24, which may be connected with, for example, an antenna that is susceptible to ESD events and the associated high current pulses. The interconnect line 18 may be coupled with a ground potential by, for example, vias and wiring in a metallization level either above or below the metallization level 10. The interconnect lines 16 and 20 may be coupled with an integrated circuit 26, such as a transceiver, receiver, or low noise amplifier, that is designated to be protected from ESD events.

The interconnect lines 16, 18, 20, 22 may have equal thicknesses, t, when formed in the same metallization level 10. The interconnect line 18 may have a width, wt, that is greater than the width, w2, of the interconnect lines 16 and 20, and the interconnect line 18 may be separated from the interconnect line 16 and the interconnection line 20 by a space, s, of a given perpendicular dimension. The interconnect line 18 has a cross-sectional area given by the product of the thickness and its width. Similarly, the interconnect lines 16 and 20 have a cross-sectional area given by the product of the thickness and their width. The cross-sectional area of the interconnect line 18 is greater than the cross-sectional area of the interconnect lines 16 and 20. The electrical resistance of the interconnect lines 16, 18, 20 is inversely proportional to the cross-sectional area. In an embodiment in which the interconnect lines 16, 18, 20 are composed of the same material(s) and have equal lengths such that the cross-sectional area is the sole variable, the electrical resistance of the interconnect line 18 will be less than the electrical resistance of the interconnect lines 16 and 20. However, the electrical resistance of the interconnect lines 16, 18, 20 exhibits a frequency dependence that arises from a frequency-dependent skin depth. As frequency increases, conduction begins to move from an equal distribution across the conductor cross-section toward existence almost exclusively near the conductor surface over a skin depth due to the skin effect.

A signal at low frequencies less than or equal to 1 gigahertz (GHz) that is received by the interconnect line 22 from the pad 24 will be routed through the interconnect line 18 to ground. The electrical resistance of the interconnect lines 16 and 20 is greater than the electrical resistance of the interconnect line 18 arising from the selection of widths and cross-section areas, and the effect of skin depth is negligible at low frequencies. The interconnect lines 16 and 20 are not grounded and are connected with the integrated circuit 26 that also has an effective resistance. A low-frequency signal originating at the pad 24 will preferentially be conducted by the interconnect line 18 to ground and diverted away from the integrated circuit 26.

A signal at high frequencies greater than or equal to 30 gigahertz (GHz) that is received by the interconnect line 22 from the pad 24 will be routed through the interconnect lines 16 and 20 to the integrated circuit 26. Due to a frequency-dependent decrease in the skin effect in the wider interconnect line 18 arising from the selection of widths and cross-section areas, the wider interconnect line 18 will exhibit a higher electrical resistance than the narrower interconnect lines 16 and 20 at high-frequencies. Current will be conducted only over the skin depth of the interconnect line 18, which reduces its effective cross-sectional area for current conduction and effectively increases its electrical resistance. The cross-sectional area of the interconnect line 18 interior of the skin depth, which is the majority of the total cross-sectional area, will exhibit a high impedance. As a result, the high-frequency signal will preferentially be conducted by the interconnect lines 16 and 20 of comparatively lower electrical resistance to the integrated circuit 26, as opposed to being conducted through the interconnect line 18 of comparatively higher electrical resistance to ground.

The wiring feature 14 defines a frequency divider to provide a low-frequency path through the wider interconnect line 18 for an ESD event received by the interconnect line 22 and a high-frequency path through the narrower interconnect lines 16 and 20 for an RF signal received by the interconnect line 22. The interconnect line 18, which is wider than the interconnect lines 16 and 20, furnishes a wide metal line defining the low frequency path for the ESD event. The interconnect lines 16 and 20, which are narrower than the interconnect line 18 and arranged adjacent to the interconnect line 18, furnish narrow metal lines defining the high frequency path configured for selectively conducting the high frequency signal. At low frequencies characteristic of an ESD event, the majority of the current flows through the wider interconnect line 18 because it is grounded and of lower electrical resistance than the interconnect lines 16 and 20. The skin depth for carrying current at low frequencies is large in the wider interconnect line 18.

At high frequencies characteristic of, for example, an RF or millimeter wave signal, the majority of the current flows through the narrower interconnect lines 16 and 20 because the skin depth for carrying current at such high frequencies is significantly smaller in the wider interconnect line 18 than in the narrower interconnect lines 16 and 20. The ratio of the widths of the interconnect lines 16, 20 to the width of the interconnect line 18 may be selected, for example, based on a designated value for the high frequency. The frequency divider embodied in the wiring feature 14 provides ESD protection to the integrated circuit 26 without the need for a clamping device (e.g., a silicon-controlled rectifier) and other circuit elements, such as trigger diodes, of a conventional ESD protection circuit.

Figure 2:
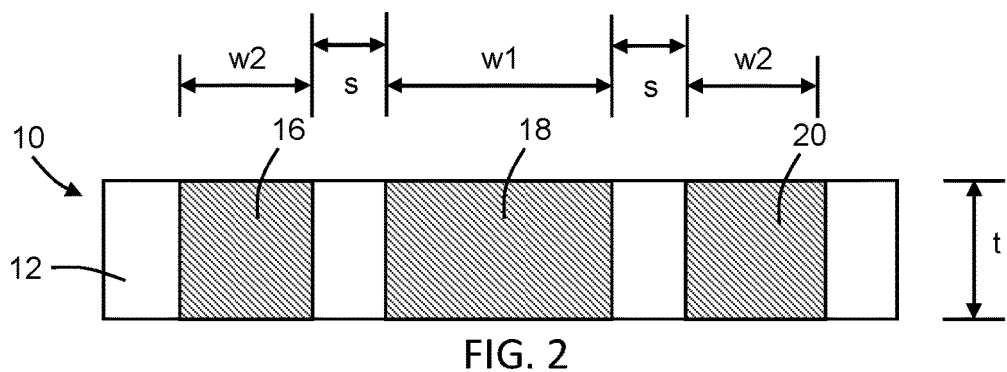
FIG. 2 is a cross-sectional view taken generally along line 2-2 in FIG. 1.
Figure 3:
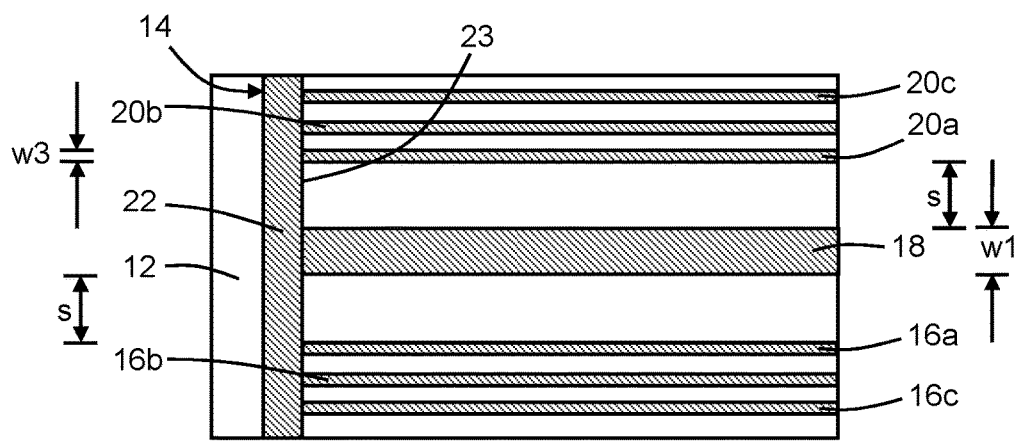
FIG. 3 is a top view of a structure in accordance with alternative embodiments of the invention.

With reference to FIG. 3 in which like reference numerals refer to like features in FIG. 2 and in accordance with embodiments of the invention, each of the interconnect lines 16 and 20 (FIG. 2) may be respectively replaced by multiple interconnect lines 16a, 16b, 16c and multiple interconnect lines 20a, 20b, 20c. The interconnect lines 16a, 16b, 16c and the interconnect lines 20a, 20b, 20c may have individual widths, w3, and are arranged with a given pitch. Each of the individual widths, w3, is less than the width, w1, of the interconnect line 18, although the sum of the individual widths of the interconnect lines 16a, 16b, 16c may be greater than the width of the interconnect line 18 and the sum of the individual widths of the interconnect lines 20a, 20b, 20c may be greater than the width of the interconnect line 18.

The interconnect line 18 is spaced from the nearest interconnect line 16a by a space of given dimension, s, and the interconnect line 18 may be spaced from the nearest interconnect line 20a by a space of the same dimension. In an embodiment, the width, w1, of the interconnect line 18 may be less than the dimension of the space. In an embodiment, a ratio of the width, w1, of the interconnect line 18 to the dimension of the space may be 0.5. The same considerations of width and spacing may apply for interconnect line 18 with respect to the interconnect lines 16 and 20 (FIGS. 1 and 2). The spaces are filled by the dielectric material of the interlayer dielectric layer 12 that provides electrical isolation. The number of interconnect lines 16a, 16b, 16c and the number of interconnect lines 20a, 20b, 20c may depend on the frequency of the high-frequency signal, density, and performance requirements.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a frequency divider, the structure comprising:
    a first interconnect line configured to selectively conduct a first signal of a first frequency; and
    a second interconnect line coupled with the first interconnect line, the second interconnect line configured to selectively conduct a second signal of a second frequency,
    wherein the first frequency is less than the second frequency.

2. The structure of claim 1 further comprising:
    a third interconnect line arranged to couple the first interconnect line with the second interconnect line, the third interconnect line configured to receive the first signal and the second signal.

3. The structure of claim 1 wherein the first interconnect line has a first width, and the second interconnect line has a second width that is less than the first width.

4. The structure of claim 3 wherein the first interconnect line and the second interconnect line have equal thicknesses and equal lengths.

5. The structure of claim 3 wherein the first interconnect line and the second interconnect line are separated by a space of a given dimension, the space is filled by a dielectric material, and a ratio of the first width to the given dimension of the space is equal to 0.5.

6. The structure of claim 1 further comprising:
    a third interconnect line coupled with the first interconnect line, the third interconnect line configured to conduct the second signal of the second frequency.

7. The structure of claim 6 wherein the first interconnect line, the second interconnect line, and the third interconnect line are arranged in a metallization level, and the first interconnect line is laterally arranged between the second interconnect line and the third interconnect line.

8. The structure of claim 6 wherein the first interconnect line, the second interconnect line, and the third interconnect line are arranged in a metallization level, the third interconnect line is laterally arranged between the second interconnect line and the first interconnect line, and further comprising:
    a dielectric layer in which the first interconnect line, the second interconnect line, and the third interconnect line are embedded.

9. The structure of claim 1 wherein the first signal is generated during an electrostatic discharge (ESD) event, and the frequency divider lacks a clamping device to respond to the ESD event.

10. The structure of claim 1 wherein the first interconnect line has a first electrical resistance at the first frequency, and the second interconnect line has a first electrical resistance at the first frequency that is greater than the first electrical resistance at the first frequency of the first interconnect line.

11. The structure of claim 10 wherein the first interconnect line has a second electrical resistance at the second frequency, and the second interconnect line has a second electrical resistance at the second frequency that is less than the second electrical resistance at the second frequency of the first interconnect line.

12. The structure of claim 11 wherein the first frequency is less than or equal to 1 gigahertz, and the second frequency is greater than or equal to 30 gigahertz.

13. The structure of claim 1 wherein the first interconnect line has a skin depth at the second frequency, and the second interconnect line has a skin depth at the second frequency that is less than the skin depth at the second frequency of the first interconnect line.

14. A method comprising:
    forming a first interconnect line configured to selectively conduct a first signal of a first frequency; and
    forming a second interconnect line coupled with the first interconnect line, the second interconnect line configured to selectively conduct a second signal of a second frequency,
    wherein the first frequency is less than the second frequency.

15. The method of claim 14 wherein the first interconnect line has a first width, and the second interconnect line has a second width that is less than the first width.

16. The method of claim 14 further comprising:
    forming a third interconnect line coupled with the first interconnect line,
    wherein the third interconnect line is configured to conduct the second signal of the second frequency.

17. The method of claim 16 wherein the first interconnect line, the second interconnect line, and the third interconnect line are arranged in a metallization level, and the first interconnect line is laterally arranged between the second interconnect line and the third interconnect line.

18. A method comprising:
    selectively conducting a first signal of a first frequency through a first interconnect line; and
    selectively conducting a second signal of a second frequency through a second interconnect line that is coupled with the first interconnect line,
    wherein the first frequency is less than the second frequency.

19. The method of claim 18 wherein the first signal is a current pulse generated during an electrostatic discharge (ESD) event, and the second signal is a millimeter wave signal.

20. The method of claim 18 wherein the first frequency is less than or equal to 1 gigahertz, and the second frequency is greater than or equal to 30 gigahertz.

* * * * *